United States Patent [19]

King et al.

[11] Patent Number: 5,227,730
[45] Date of Patent: Jul. 13, 1993

[54] MICROWAVE NEEDLE DIELECTRIC SENSORS

[75] Inventors: Ray J. King; Karl V. King, both of Pleasanton, Calif.

[73] Assignee: KDC Technology Corp., Livermore, Calif.

[21] Appl. No.: 944,524

[22] Filed: Sep. 14, 1992

[51] Int. Cl.[5] ............................................. G01R 23/02
[52] U.S. Cl. ........................................ 324/632; 324/633; 324/642; 324/643; 324/646; 343/790; 343/791
[58] Field of Search .................. 333/245, 26; 343/790, 343/791, 792; 324/344, 332, 333, 642, 645, 633, 634, 632

[56] References Cited

U.S. PATENT DOCUMENTS 3,750,184  7/1973  Kuecken ............................ 343/792
4,104,584  8/1978  Miyai .................................. 324/634
4,410,893  10/1983  Grifee ................................ 343/792

OTHER PUBLICATIONS

Tiuri: "A Microwave Instrument . . . " Journal of Microwave Power, vol. 9, pp. 117–121—Jun. 1974.
Xu, Y., et al. "Theoretical and Experimental Study of Measurement of Microwave Permittivity Using Open Ended Elliptical Coaxial Probes," IEEE Trans. AP-40(1), Jan. 1992, pp. 143–150.

Primary Examiner—Kenneth A. Wieder
Assistant Examiner—Jose M. Solis
Attorney, Agent, or Firm—Henry P. Sartorio

[57] ABSTRACT

Method and apparatus for in vivo or in vitro sensing of complex dielectric properties of lossy dielectric materials, particularly biological tissue. Configured as a needle-like dielectric sensor, a coaxial cable (1) having a circumferential gap (12) in the shield (2) is wrapped with an electrically thin dielectric substrate (18). The cable center conductor (6) extends immediately past gap (12) and is shorted to cable shield (2). A thin conductive dipole resonator (16) is positioned on substrate (18) and over feed gap (12) to achieve inductive coupling between the cable center conductor (6) and the dipole resonator (16) through gap (12). Superstrate (22), which could be a dielectric catheter, covers the entire sensor assembly (10). By measurement of the resonator resonant frequency and the input impedance matching factor at the resonant frequency, the real and imaginary dielectric components ($\epsilon'$, $\epsilon''$) of the test material into which the sensor is inserted are determined.

14 Claims, 2 Drawing Sheets

MICROWAVE NEEDLE DIELECTRIC SENSORS

GOVERNMENT RIGHTS

This invention was made with Government support under Grant 1 R43 CA 53941-01 awarded by the National Institutes of Health. The Government has certain rights in the invention.

BACKGROUND—FIELD OF INVENTION

This invention relates to the construction and use of needle-like microwave sensors for in vivo or in vitro measurement of dielectric properties of lossy dielectric media, particularly biological tissue.

BACKGROUND—DISCUSSION OF PRIOR ART

Miniature open-ended coaxial cables have been extensively used to measure the in vivo or in vitro complex dielectric constant $\epsilon^*$ ($=\epsilon'$-$j\epsilon''$) of biological tissue and liquids. When the cable open end is placed against or inserted into the test material, the wave reflected from the open end is diagnostic of the ($\epsilon'$, $\epsilon''$) components of the material. Using a suitable swept frequency microwave source with associated microwave instrumentation supported by mathematical analysis, ($\epsilon'$, $\epsilon''$) can be measured over very broad bandwidths, e.g., 0.5 to 15 GHz. Cables having circular, and more recently, elliptical cross-sections have been used. For a list of references relating to the state of the art, see (Xu, Ghannouchi and Bosisio, IEEE Trans. on Microwave Theory and Techniques, MTT-40(1), January, 1992).

While such open-ended sensors are exceedingly simple, broadband, and have high spatial resolution, they lack accuracy and resolution in the measurement of ($\epsilon'$, $\epsilon''$). For example, it is desirable to have sufficient sensitivity to distinguish the dielectric properties of cancerous tissue and the surrounding normal tissue. Such dielectric differences, which are generally attributed to the slightly higher water content of cancerous tissue, are typically only a few percent. Further, because the sensing region at the open end is so small (a few mm$^3$), it has very high spatial resolution. This type of probe is therefore most suitable for "soft" tissue and liquids wherein the test material easily makes intimate physical contact with the sensor open end. Conversely, the open-ended sensor is not appropriate in situations where it is desired to make average readings over a larger region, e.g., when measuring the bulk properties of granular materials such as powders.

The invention relates to the construction and use of needle-like resonant sensors which are inserted into the test material for measurement of the material dielectric ($\epsilon'$, $\epsilon''$) properties at the resonant frequency. The major advantages, compared to open-ended broadband sensors, are that $\epsilon'$ can be measured with much greater accuracy and resolution, and that the bulk $\epsilon'$ is measured over a much larger volume (of the order of a cubic centimeter). Also, the resonant sensor is able to distinguish between different types of biological tissue (e.g., tumors and normal), and is able to measure the bulk dielectric properties of granular materials.

SUMMARY OF THE INVENTION

The invention is method and apparatus for a needle-like reflection resonant sensor for insertion into dielectric test materials and measurement or monitoring of the complex relative dielectric constant, $\epsilon^*$ ($=\epsilon'$-$j\epsilon''$). It has the form of a dipole resonator which is positioned parallel and adjacent to, and electrically insulated from, a miniature coaxial feed cable. The dipole resonator is inductively coupled to the microwave power in the coaxial cable by means of an electrically short circumferential gap cut in the cable shield. By coupling the gap to the dipole at its center currents are induced in the dipole in a perfectly balanced and symmetric manner. With proper design of the feed gap, the dipole impedance can be well matched to the coaxial cable with very small reflection from the gap at the resonant frequency of the dipole.

When a sensor thus formed is inserted into a test material, the dielectric properties of the material ($\epsilon'$) and ($\epsilon''$) have pronounced effects on the dipole resonant frequency ($f_r$) and the input impedance matching(or coupling) factor ($r_o$), respectively. At $f_r$ the fields in the immediate neighborhood of the dipole are strongly coupled to the test material. To regulate the degree of coupling between the dipole and the test medium, a thin cylindrical dielectric sheath encloses the entire assembly. Such a sheath might be, for example, a dielectric catheter into which the coaxial cable with its attached dipole resonator is inserted.

Using suitable microwave instrumentation, e.g., a scalar or vector network analyzer, the wave reflected from the sensor is measured. At $f_r$, this reflected wave dips to a sharp minimum, providing sufficient information to determine $\epsilon'$ of the test medium. Similarly, the amplitude of the reflection coefficient at the minimum provides information for determining $r_o$ and hence $\epsilon''$.

The dielectric sensor invention is designed to achieve the desired sensitivity of the measured $f_r$ and $r_o$ to $\epsilon'$ and $\epsilon''$ of the test material, respectively, without regard to radiation patterns in the test material.

OBJECTS AND ADVANTAGES

Accordingly, the following objects and advantages are claimed:

The invention provides a needle-like microwave resonator sensor which can be inserted into a penetrable dielectric material for the purpose of measuring or monitoring the dielectric properties ($\epsilon'$, $\epsilon''$) of the material. Being a resonator device, the sensor is exceptionally sensitive to small variations in ($\epsilon'$, $\epsilon''$) of the material. Such variations may be caused by, for example, changes in material constituents, such as moisture, chemical reactions, density, porosity, etc., or by spatial nonhomogeneties, such as a tumor surrounded by normal tissue, as monitored by moving the sensor. The sensor has the additional advantage that it measures the bulk dielectric properties of the material immediately surrounding the dipole resonator, and is therefore not susceptible to macroscopic nonhomogenieties.

DESCRIPTION OF DRAWINGS

The characteristics and advantages of the invention will appear from the following description illustrated by the figures which show:

In FIGS. 1 and 2, the diameters of the sensor or probe have been greatly expanded to show construction detail.

LIST OF REFERENCE NUMERALS

Figure 1:
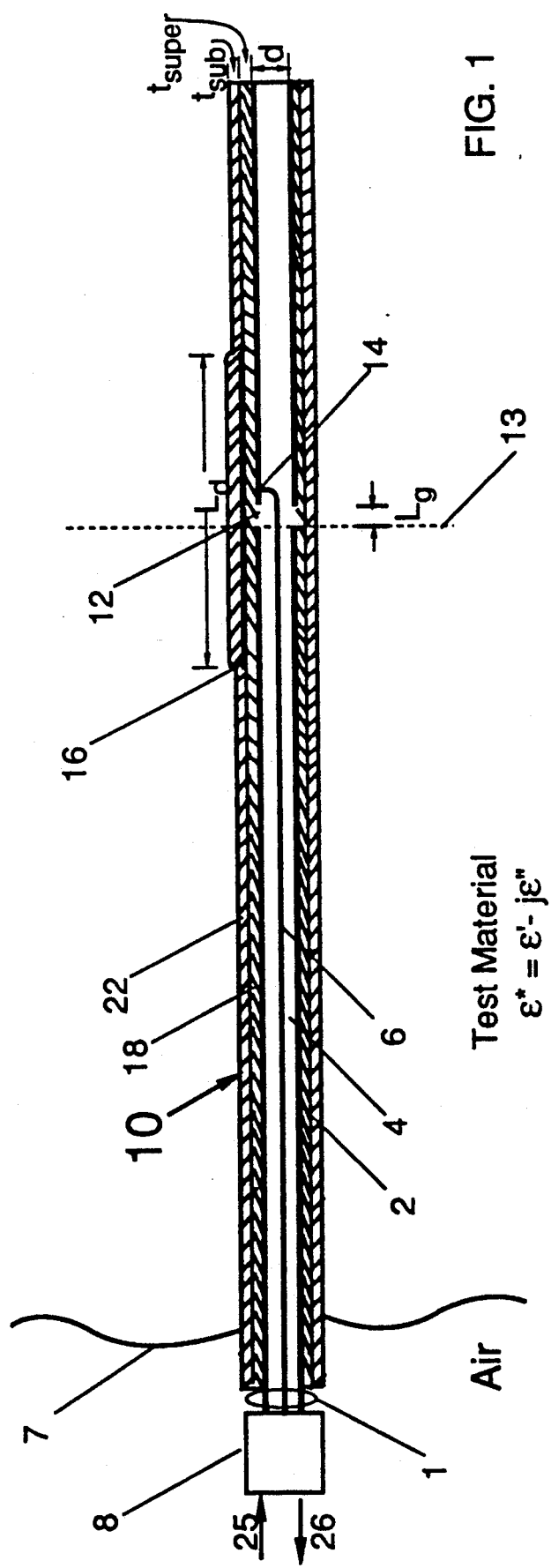
FIG. 1: Cross section view of needle-like microwave reflection resonator sensor for measuring or monitoring the dielectric properties of materials.

1. Coaxial cable
2. Outer conducting shield of coaxial cable 1 of diameter d
4. Dielectric core (e.g., Teflon ®) of coaxial cable 1
6. Center conductor of coaxial cable 1
7. Test material having complex dielectric constant $\epsilon^* = \epsilon' - j\epsilon''$
8. SMA or other suitable connector to sensor 10
10. Needle-like microwave reflection resonator sensor assembly
12. Circumferential feed gap in the outer conducting shield 2 of coaxial cable 1
13. Reference plane at the input to feed gap 12
14. Short circuit connection of coaxial cable center conductor 6 to outer shield 2
16. Metal foil dipole resonator of length $L_d$
17. Conductive coupling reducer strip or baffle
18. Thin dielectric substrate of wall thickness $t_{sub}$ which electrically insulates dipole resonator 16 from cable shield 2
19. Thin dielectric substrate for insulating coupling reducer 17 from cable shield 2
22. Thin dielectric superstrate (e.g., catheter) of wall thickness $t_{super}$ which electrically insulates dipole 16 from test material 7
24. Resistive bridge wire which extends across gap 12 to regulate inductive coupling to dipole 16
25. Incident wave
26. Reflected wave

OPERATION OF THE INVENTION

Referring now to the drawings, FIG. 1 shows the cross section of needle-like reflection resonator sensor assembly 10 inserted into a dielectric test material 7 having complex dieletric constant $\epsilon^* = \epsilon'' - j\epsilon''$. Sensor 10 is comprised of a miniature coaxial cable 1 having outer conducting shield 2 of diameter d, center conductor 6 and core dielectric 4. A narrow (electrically short) circumferential gap 12 is formed in shield 2 entirely around cable 1. Connector 8 is provided to connect sensor 10 to a suitable swept frequency source of microwave power (a few mw), and associated instrumentation e.g., a scalar or vector network analyzer for measuring the reflection coefficient at reference plane 13 located at feed gap 12. Incident wave 25 and reflected wave 26 at connector 8 represent the signals from and to the associated instrumentation. Cable center conductor 6 is shorted to the extension of shield 2 at point 14 just beyond gap 12 so as to create a large current and corresponding magnetic field at gap 12. A cylindrical substrate 18, such as Teflon ® heat-shrink tubing of thickness $t_{sub}$ covers sensor 10, including gap 12. A dipole resonator 16 is placed on substrate 18 over gap 12. The function of substrate 18 is to electrically insulate dipole resonator 16 from cable shield 2. Dipole resonator 16 of length $L_d$ and width $w_d$ is a thin strip of highly conducting metal (e.g., copper foil of thickness 0.0005 inches). Length $L_d$ of dipole 16 is chosen according to the desired resonant frequency ($f_r$); at resonance $L_d$ is one half wavelength, the wavelength chiefly being determined by the capacitance between dipole 16 and cable shield 2. Width $w_d$ of dipole 16 also serves to establish this capacitance and the desired coupling between dipole 16 and gap 12. Superstrate 22, which covers substrate 18 and resonator 16, serves to regulate the coupling of the electromagnetic fields near dipole 16 to the surrounding test material 7. Superstrate 22 could also be a dielectric catheter into which the remainder of sensor assembly 10 can be inserted.

Sensor 10 of FIG. 1 is useful for accurately measuring or monitoring the dielectric properties ($\epsilon'$, $\epsilon''$) of test material 7, since the magnetic field at circumferential gap 12 inductively couples to resonator dipole 16. Thus, an electrically equivalent network representing the impedance seen at plane 13 is comprised of a parallel $R_oLC$ network, driven by a perfect input transformer of turns ratio n:1. Here, L and C are the equivalent lumped inductance and capacitance, respectively, of dipole 16, and $R_o$ represents the effective lumped losses, primarily due to losses in test material 7. The n:1 transformer represents inductive coupling of circumferential gap 12 to dipole 16. The resonant frequency is $$f_r = 1/[2\pi(LC)^{\frac{1}{2}}] \tag{1}$$

in which L is fixed due to the nonmagnetic properties of sensor 10 and test material 7. To a first order the capacitance C is given by $$C = C_o + K(\epsilon' - 1) \tag{2}$$

where $C_o$ is chiefly the lumped capacitance between dipole 16 and cable shield 2, determined by the width $W_d$ of dipole 16 and the thickness $t_{sub}$ and dielectric constant of substrate 18. The second term in Eq. (2) represents the effects of electric fields around dipole 16 which fringe into test material 7, where K is a fringing constant. $C_o$ is therefore the effective capacitance of the equivalent parallel $R_oLC$ network when the surrounding test material 7 is air for which $\epsilon' = 1$. The second term in Eq. (2) represents the effect of test material 7 when it is something other than air. When Eq. (2) is inserted into Eq. (1), $f_r$ decreases linearly with $\epsilon'$ with sensitivity (slope) of $$\frac{\partial f_r}{\partial \epsilon'} = \frac{-K}{2C_o} f_r \tag{3}$$

Although not necessary, sensor 10 is typically designed such that $C_o/K >> 1$ and $f_r$ decreases linearly with $\epsilon'$. The thickness $t_{super}$ and dielectric constant of superstrate (or catheter) 22 determines the degree (K) of fringing fields which couple from resonant dipole 16 into test material 7. Equivalently, superstrate 22 in conjunction with substrate 18, determines the ratio $C_o/K$ in Eq. (2), and hence the sensitivity Eq. (3) of $f_r$ to $\epsilon'$.

The secondary resistance ($R_o$) of the equivalent $R_oLC$ network representing sensor 10 includes the lumped effects of all losses. Since test material 7 is in close physical contact with dipole resonator 16, the dissipative losses of test material 7 are dominant over the radiation and resistive losses of dipole 16. Assuming this to be the case, analysis shows that $$R_o = \frac{N\sqrt{C}}{\epsilon''} \tag{4}$$

where N is a constant and $\epsilon''$ is the loss factor of test material 7. Thus, $R_o$ is essentially determined by $\epsilon''$, inversely.

At resonance, $R_o$ is transformed through the n:1 transformer representing inductive coupling through gap 12. When this transformed resistance is normalized by the characteristic resistance, $R_c$, of cable 1, the impedance mismatch or coupling factor at plane 13 is $$r_o = n^2 R_o/R_c = \frac{n^2 N \sqrt{C}}{R_c \epsilon''} \quad (5)$$

and is defined in terms of $\epsilon'$ (see Eq. (2)) and $\epsilon''$ of test material 7. When $r_o = 1$, cable 1 is perfectly matched and the reflected wave 26 and the reflection coefficient at plane 13 are zero, a condition known as "critical" coupling. When $r_o < 1$ the sensor is said to be "undercoupled," and it is "overcoupled" when $r_o > 1$. The well-known relationship between $r_o$ and the real reflection coefficient $\Gamma_r$ at plane 13 when the sensor is resonant at $f_r$ is $$\Gamma_r \text{ in dB} = 20 \log \left| \frac{r_o - 1}{r_o + 1} \right| \quad (6)$$

Note that when sensor 10 is critically coupled at $f_r$, the magnitude of the complex reflection coefficient is $\Gamma_r = -\infty$ dB. In contrast, at frequencies far removed from $f_r$, the magnitude of the complex reflection coefficient is $|\Gamma| = 0$ dB, i.e., reflected wave 26 equals incident wave 25. Thus, $|\Gamma|$ dips to a very sharp minimum at $f_r$ when the sensor is nearly critically coupled. This is an important feature of the invention since it permits precise measurement of $f_r$ even when the Q-factor of resonant dipole 16 is low due to losses of surrounding test material 7. This feature makes measurement or monitoring of the dielectric properties ($\epsilon'$, $\epsilon''$) of test material 7 possible with extremely high resolution.

For practical use of the invention, $r_o$ should lie within a window which will always cause $\Gamma_r$ to be smaller than some value needed to accurately track $f_r$ with the required resolution. For example, if $\Gamma_r$ is required to be less than $-10$ dB, then according to Eq. (6), $r_o$ must lie in the 4:1 window $0.5 < r_o < 2.0$. As seen from Eq. (5), the width of this window determines the range over which $\epsilon''$ can vary, e.g., 4:1. Then, to bring $r_o$ within the desired range, e.g., $0.5 < r_o < 2$, the turns ratio n in Eq. (5) is appropriately chosen.

Figure 2A:
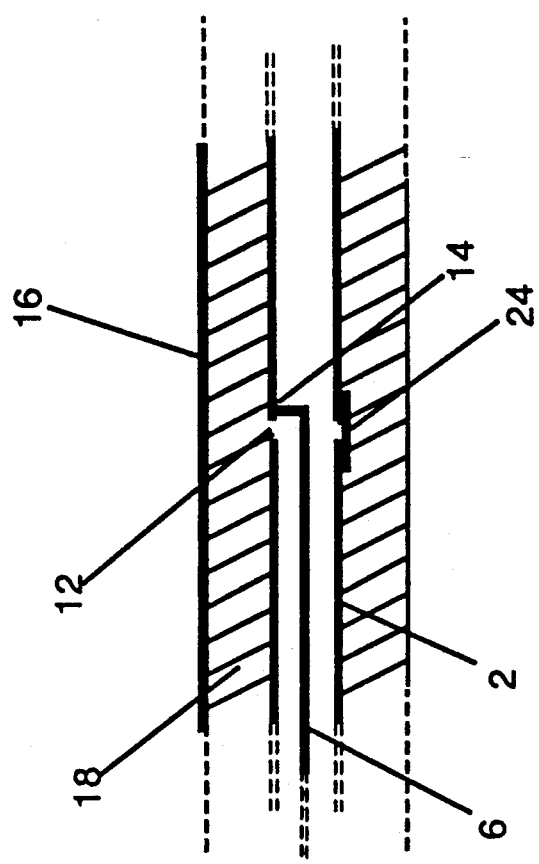
FIG. 2: A,B Partial longitudinal cross section views of resonator sensor, showing detail of methods for reducing coupling between the feed gap and the resonator using (A) a coupling reducer strip (baffle), and (B) a resistive wire bridge.
Figure 2B:
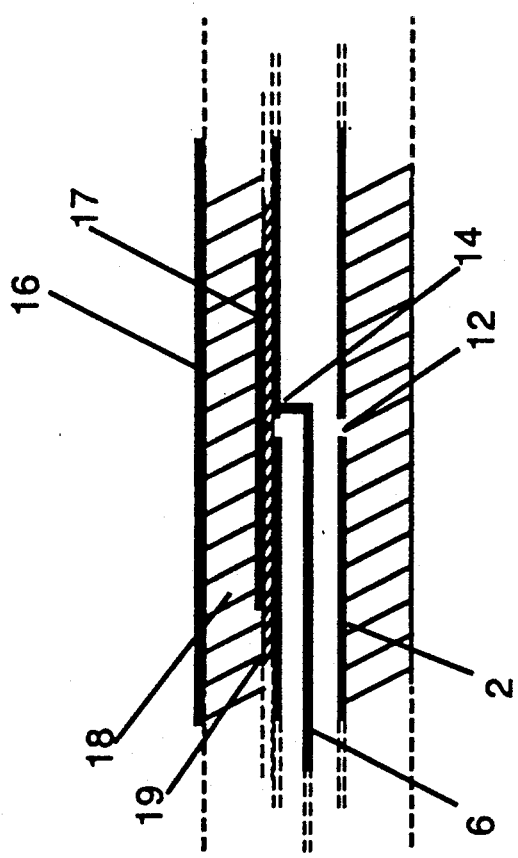

By nature, resonator 16 is usually greatly overcoupled ($2 < r_o$) to gap 12. There are several ways to reduce $r_o$:

a. by reducing the length $L_g$ of gap 12. In effect, this reduces the magnetic field coupling to resonator 16. The practical limit is when the two sides of the gap nearly touch upon flexing sensor 10.

b. by increasing the thickness, $t_{sub}$, of substrate 18. Again, this reduces the magnetic field coupling to resonator 16. Here, the limit is the practical overall diameter of sensor 10.

c. by adding a conducting coupling reducer strip or baffle 17 positioned symmetrically over gap 12 and under resonator 16. Baffle 17 is electrically insulated from resonator 16 and cable shield 2 by substrates 18 and 19 as shown in FIG. 2A. Baffle 17 can take several forms, such as a strip of conducting foil placed between substrates 18 and 19. The length $L_b$ of baffle 17 is typically substantially shorter than $L_d$ of resonator 16, and having a width $w_b$ less than $w_d$ of resonator 16. The function of baffle 17 is to reduce the exposure of resonator 16 to the driving electric field across gap 12 over an appreciable fraction of the width of resonator 16. An important advantage of this solution is that a prescribed, stable and reduced value of $r_o$ is achieved by choice of the width $w_b$ of baffle 17 in relation to the width $w_d$ of resonator 16, without significantly increasing the overall diameter of sensor 10. In another form, baffle 17 could be a strip of dielectric film metalized on one side, while the opposing dielectric side serves as substrate 19 which is positioned around cable shield 2 and gap 12.

d. by connecting a resistive bridge 24 across gap 12 as shown in FIG. 2B. This resistive bridge 24 might take the form, for example, of a short segment of highly resistive wire or a thin film resistor, held in firm contact with cable shield 2 by heat-shrink dielectric substrate 18. Bridge 24 is placed at a position across gap 12 that is generally opposite the position of dipole resonator 16. When bridge 24 is used, its conductance $G_b$ is in parallel with $n^2 R_o$ of Eq. (5). Then, the mismatch or coupling factor $r_o$ of these parallel resistances at plane 13 becomes $$r_o = \frac{n^2 N \sqrt{C}}{R_c (n^2 N \sqrt{C} G_b + \epsilon'')} \quad (7)$$

so that $r_o$ in Eq. (7) using bridge 24 is less than $r_o$ in Eq. (5) without bridge 24. A disadvantage of bridge 24 is that it reduces the sensitivity of $r_o$ to changes in $\epsilon''$ of test material 7.

e. by moving dipole 16 along the axis of sensor 10 so that the center of dipole 16 is offset from gap 12. Maximum coupling occurs when dipole 16 is centered over gap 12.

Any one or combination of methods a–e above can be effective in reducing the mutual coupling between dipole resonator 16 and gap 12 of sensor 10 in FIG. 1.

Calibration of sensor 10 is simply accomplished using air and one "standard" test material 7 having known $\epsilon_s'$ and $\epsilon_s''$. Let $f_a$ and $f_s$ be the resonant frequencies when sensor 10 is located in air and when inserted into the calibration "standard," respectively. Then, using Eq. (1) and Eq. (2), the ratio $C_o/K$ is found, $$C_o/K = \frac{\epsilon_s' - 1}{(f_a/f_s)^2 - 1} \quad (8)$$

Having found $C_o/K$, the unknown real dielectric constant for test material 9 is determined as $$\epsilon' = 1 + \frac{C_o}{K} [(f_a/f_r)^2 - 1] \quad (9)$$

where $f_r$ is the resonant frequency when sensor 10 is inserted into unknown dielectric test material 7. In certain instances, $f_a$ cannot be measured because the corresponding $r_o$ is too large. In this event, it is possible to use a second "standard" dielectric having an $\epsilon_s''$ which gives an acceptable $r_o$, e.g., one for which $0.5 < r_o < 2.0$. Eq. (8) and Eq. (9) can then be accordingly modified for this case to find $C_o/K$ based on the second standard, and to determine $\epsilon'$ of dielectric test material 7.

To determine $\epsilon''$ of dielectric test material 7, take the product $f_r r_o$ using Eq. (1) and Eq. (5), $$\epsilon'' = N/f_r r_o \quad (10)$$

where N' ($=n^2N/2\pi R_cL^{\frac{1}{2}}$) is a constant which can be found by inserting sensor 10 into the "standard" calibration material having known $\epsilon_s''$, resonant frequency $f_s$ and coupling factor, $r_{os}$, $$N' = \epsilon_s''f_sr_{os} \quad (11)$$

In some applications it is not necessary to find the absolute value of $\epsilon''$ of dielectric test material 7. Such a case arises, for example, when measuring the moisture content and dry density of test material 7. In such cases, it is sufficient to simply known $\epsilon''/N'$, i.e., to known how $\epsilon''$ varies (within constant N') as a function of the moisture content and dry density.

CONCLUSION AND SCOPE OF INVENTION

While the above description of the invention contains many specificities, these should not be construed as limitations on the scope of the invention. Rather, they are exemplifications of preferred embodiments. Many other variations and applications are possible, some of which are discussed below.

In the embodiment of sensor 10 of FIG. 1, it is obvious that the dipole form of resonator 16 could be replaced by some other shape. Moreover, a method other than inductive coupling of the gap 12 to resonator dipole 16 could be used, such as capacitive coupling between center conductor 6 and dipole 16. The use of gap 12 is preferred, however, because of its simplicity.

It would also be possible to position two or more dipole resonators on sensor 10, each resonator having its own resonant frequency. In this manner, the dielectric properties of test material 7 can be measured or monitored at two or more frequencies, all fed by the same gap 12.

Dipoles 16 need not be centered over gap 12, but doing so maximizes coupling and avoids a resonant mode at twice the resonant frequency of the lowest order mode.

Desired coupling between gap 12 and dipole resonator 16 in sensor 10 of FIG. 1 may be achieved by applying any one or combination of the methods a-e discussed under the Operation of the Invention heading. In particular, the use of a coupling reducer baffle 17 as shown in FIG. 2B is very effective for accomplishing a good impedance match (e.g., $0.5 < r_o < 2.0$) when the invention is inserted into surrounding lossy material 7. This match can be accomplished without appreciably increasing the diameter of sensor 10, while still maintaining symmetry, high efficiency and simple, robust construction of the invention.

Superstrate 22 in sensor 10 could be catheters into which the assemblies are inserted.

There are several methods for inductively coupling coaxial center conductor 6 to circumferential gap 12 in FIGS. 1 and 2. As shown, center conductor 6 extends beyond gap 12 and is terminated in a zero impedance short to cable shield 2 at point 14, which is the preferred embodiment. However, center conductor 6 could be terminated in any impedance which gives the desired coupling to gap 12. For example, center conductor 6 could extend beyond gap 12 a distance of an odd multiple of quarter wavelengths at the resonant frequency and be terminated in an open circuit. This arrangement would yield an equivalent short circuit at the location of gap 12. More generally, center conductor 6 could be terminated by any of many suitable load impedances beyond gap 12, provided center conductor 6 extends beyond gap 12 by an appropriate distance so that such a load impedance is transformed into the desired impedance at gap 12. For example, a resistive load located one quarter wavelength beyond gap 12 would determine the magnitude of the magnetic field and hence the coupling factor $r_o$ at gap 12. Such a termination would reduce the coupling factor $r_o$, and could replace resistive bridge 24 in FIG. 2B which serves a similar function. Whatever the terminating arrangement used, it is generally undesirable to have a net non-zero reactance at reference plane 13 at the true resonant frequency of the resonator ($f_r$) since such a reactance would alter the observed resonant frequency at plane 13.

Coaxial cable 1 need not be rigid or semi-rigid. In fact, the entire assembly 10 in FIG. 1 could be flexible.

Use of sensor 10 in FIG. 1 is not restricted to biological tissue, and can be used in many types of "soft" materials (e.g., powders or liquids) into which sensor 10 can easily be inserted. The invention could even be embedded in solids. For example, the outer dielectric sheath (superstrate 22 in FIG. 1) could be permanently embedded in a solid, and the remainder of sensor assembly 10 could be inserted into the embedded dielectric sheath whenever desired.

Accordingly, the scope of the invention should be determined not by the embodiments illustrated but by the appended claims and their legal equivalents.

We claim:

1. A needle-like microwave reflection resonator sensor apparatus for measuring or monitoring the dielectric properties of materials comprising:

a coaxial cable having a metal shield and center conductor;

an electrically short circumferential gap in the metal shield of the coaxial cable, the center conductor of the coaxial cable extending immediately beyond the gap and then shorted to the cable shield, the gap defining a transverse input plane;

an electrically thin dielectric substrate sheath covering the cable shield;

a thin conductive resonator placed on the substrate sheath and positioned near the gap to facilitate inductive coupling between the gap and the resonator such that the impedance matching factor $r_o$ of the cable at the transverse input plane lies in the range $0.5 < r_o < 2.0$ at the resonant frequency of the resonator when the sensor is exposed to a material being measured or monitored.

2. The reflection resonator sensor of claim 1 wherein the microwave resonator is a thin metal dipole positioned parallel to the cable axis.

3. The reflection resonator sensor of claim 1 further comprising an electrically thin dielectric superstrate sheath covering the resonator, the dielectric substrate sheath, and the coaxial cable.

4. The reflection resonator sensor of claim 3 wherein the dielectric superstrate sheath comprises a catheter into which the reflection resonator sensor can be inserted.

5. The reflection resonator sensor of claim 1 further comprising a swept microwave frequency source connected to the coaxial cable, means for detecting a wave which is reflected from the sensor, and means to determine the resonant frequency of the resonator and the input impedance matching factor at the resonant frequency of the resonator.

6. A needle-like microwave reflection resonator sensor for measuring or monitoring the dielectric properties of materials, comprising:
   a coaxial cable having a metal shield and center conductor;
   an electrically short circumferential gap in the metal shield of the coaxial cable, the center conductor of the coaxial cable extending immediately beyond the gap, and then shorted to the cable shield, the gap defining a transverse input plane;
   an electrically thin dielectric substrate sheath covering the cable shield;
   one or more thin conductive dipole resonators having different resonant frequencies, placed on the substrate sheath and positioned near the gap to facilitate inductive coupling between the gap and all of the resonators simultaneously so that the impedance matching factor $r_o$ of the cable at the transverse input plane lies in the range $0.5 < r_o < 2.0$ at the resonant frequency of one or more resonators when the sensor is exposed to the material being measured or monitored.

7. The reflection resonator sensor of claim 6 further comprising an electrically thin dielectric superstrate sheath covering the one or more dipole resonators, the dielectric substrate sheath, and the coaxial cable.

8. The microwave resonator sensor of claim 6 further comprising a conductive coupling reducer strip or baffle positioned between, and electrically insulated from, the one or more dipole resonators and the cable shield, said coupling reducer strip or baffle producing the desired impedance matching factor of one or more of the dipole resonators.

9. A microwave reflection resonator sensor for measuring or monitoring the complex dielectric properties of materials, comprising:
   a coaxial cable having a metal shield and a center conductor;
   an electrically short circumferential gap in the metal shield of the coaxial cable, the gap defining a transverse input plane;
   an electrically thin dielectric substrate sheath covering the cable shield;
   a thin conductive resonator placed on the substrate sheath near the gap to facilitate inductive coupling between the resonator and the gap;
   an electrical feed means for coupling microwave power to and reflected from the gap, said feed means operating with an impedance matching factor $r_o$ of the cable at the transverse input plane in the range $0.5 < r_o < 2.0$ at the resonant frequency of the resonator when the sensor is exposed to a material being measured or monitored.

10. The reflection resonator sensor of claim 9 wherein the electrical feed means comprises an extension of the center conductor of the coaxial cable a short distance beyond the gap, the extension being shorted to the cable shield beyond the gap.

11. The reflection resonator sensor of claim 9 wherein the electrical feed means comprises an extension of the center conductor of the coaxial cable beyond the gap and termination of the cable in an impedance which is selected to achieve a desired sensor input impedance matching factor.

12. The microwave resonator sensor of claim 9 further comprising a conductive coupling reducer strip or baffle positioned between, and electrically insulated from, the resonator and the cable shield, said coupling reducer strip or baffle producing the desired impedance matching factor.

13. The microwave resonator sensor of claim 9 further comprising a resistive bridge electrically connected across the gap for establishing the desired impedance matching factor, or for reducing the sensitivity of the matching factor to the loss factor of a material being measured or monitored, or both.

14. A method for in vivo or in vitro sensing the complex dielectric properties of lossy dielectric materials, comprising:
   forming an electrically short circumferential gap in the shield of a coaxial cable, the gap defining a transverse input plane;
   extending the cable center conductor immediately beyond the gap and then shorting the center conductor to the cable shield;
   enclosing the gap and the cable with a thin dielectric substrate sheath;
   placing a thin conductive resonator on the dielectric sheath;
   positioning the resonator near the gap to facilitate inductive coupling between the gap and the resonator such that the impedance matching factor $r_o$ of the cable at the transverse input plane lies in the range $0.5 < r_o < 2.0$ at the resonant frequency of the resonator when the sensor is exposed to the material being measured or monitored;
   exposing the sensor to a dielectric material being measured or monitored;
   detecting a wave reflected from the transverse input plane;
   measuring the resonant frequency and impedance matching factor of the sensor at the resonant frequency.

* * * * *